United States Patent

Fujii et al.

[11] Patent Number: 6,033,470
[45] Date of Patent: *Mar. 7, 2000

[54] METHOD OF PRODUCING A CERIUM-CONTAINING MAGNETIC GARNET SINGLE CRYSTAL

[75] Inventors: Takashi Fujii, Otsu; Takenori Sekijima, Shiga-ken; Kikuo Wakino, Muko; Masakatsu Okada, Kyoto, all of Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/822,309

[22] Filed: Mar. 21, 1997

[30] Foreign Application Priority Data

Mar. 22, 1996 [JP] Japan ................................ 8-093581
Feb. 14, 1997 [JP] Japan ................................ 9-047298

[51] Int. Cl.$^7$ .................................................. C30B 13/22
[52] U.S. Cl. ............................... 117/44; 117/41; 117/43; 117/47; 117/50
[58] Field of Search ........................ 117/11, 13, 37, 117/41, 43, 44, 47, 50, 51, 52, 904, 905

[56] References Cited

U.S. PATENT DOCUMENTS 5,077,271 12/1991 Hiskes et al. ............................. 505/1
5,434,101 7/1995 Yamasawa et al. ..................... 438/1

FOREIGN PATENT DOCUMENTS

| 0000720 | 7/1978 | European Pat. Off. |
| 0796931 A1 | 9/1997 | European Pat. Off. |
| 58-015100 | 1/1983 | Japan |
| 59-069498 | 4/1984 | Japan |
| 2-208906 | 8/1990 | Japan |
| 4-338191 | 11/1992 | Japan |
| 9350878 | 3/1993 | Japan |
| 6-263596 | 9/1994 | Japan |
| 86/04619 | 8/1986 | WIPO |

OTHER PUBLICATIONS

Blum, *IBM Technical Diclosure Bullentin*, "Vertical–Gradient Freeze Growth of Garnet Crystals", vol. 19, No. 6, Nov. 1976, pp. 2318–2319.

"Sputtered Garnet Media for Magneto—Optic Data Storage"; Shong et al; J. Magnetic Mater, 88 (1–2), (1990), pp. 205–210, (Abstract Only!).

*Primary Examiner*—Felisa Hiteshew
*Attorney, Agent, or Firm*—Ostrolenk, Faber, Gerb & Soffen, LLP

[57] ABSTRACT

The present invention provides a cerium-containing magnetic garnet single crystal having a size large enough to use as a material for optical communication of an isolator and for an electronic device, and a production method therefor. The cerium-containing magnetic garnet single crystal of the present invention is obtained by melting a cerium-containing magnetic garnet polycrystal while applying a sharp, large temperature gradient to the solid-liquid interface of the melt and the solid, and then solidifying the melted polycrystal. The polycrystal is preferably heated by using an optical heating device, for example, a combination of a main heating device using a laser beam, and an auxiliary heating device using reflected light from a halogen lamp.

15 Claims, 5 Drawing Sheets

MELT ZONE    HEATING PORTION

METHOD OF PRODUCING A CERIUM-CONTAINING MAGNETIC GARNET SINGLE CRYSTAL

BACKGROUND OF THE INVENTION

1. Field of the Invention

The present invention relates to a cerium-containing magnetic garnet single crystal, and a production method therefor, and particularly to a cerium-containing magnetic garnet single crystal used as a photomagnetic optical element material and a magnetostatic element material, for example, for optical communication and optical recording of an optical isolator and the like, and a production method therefor.

2. Description of the Related Art

Conventionally, materials for an optical isolator, an important device for optical communication, are required to have low light absorption in the wavelength band used, a large Faraday effect and low change with temperature. As materials satisfying these conditions, iron-containing magnetic garnet single crystals, for example, yttrium.iron.garnet single crystals ($Y_3Fe_5O_{12}$: referred to as "YIG" hereinafter) have previously been developed. Such YIG is an incongruent melting type compound, and a YIG single crystal cannot be obtained directly from a raw material having a coincident melt composition. Therefore, the YIG single crystal is generally produced by a flux method.

In addition, since the YIG single crystal has drawbacks with respect to a small angle of Faraday rotation and the high dependency of the angle of Faraday rotation on temperature, the Y site is replaced by Bi as a measure against the small angle of Faraday rotation, and the Y site is replaced by a rare earth element such as Gd or the like as a measure against the high dependency on temperature.

It has recently been found that replacement of $Y^{3+}$ of the YIG single crystal by $Ce^{3+}$ produces a large Faraday effect. However, the sputtering method of production of a magnetic garnet single crystal in which the Y site is replaced by Ce (abbreviated to "Ce:YIG" hereinafter) has the problem that only a film having a thickness of about 1 to 2 $\mu$m can be obtained, and such a film is insufficient for use as a material for optical communication and as an electronic device.

In order to obtain a thick film of Ce:YIG, therefore, an attempt has been made to produce Ce:YIG by the same method as a magnetic garnet material in which Y is replaced by Bi and Gd (abbreviated to "BIGd:YIG" hereinafter) and which is used as a conventional isolator material. The method of producing BiGd:YIG is described below.

YIG is known as a so-called incongruent melting type compound and is decomposed, as the temperature is increased, at about 1570° C. Even when a YIG melt having a stoichiometric composition is solidified, YIG cannot be obtained, but a mixture of orthoferrite and iron oxide is obtained. Accordingly, in order to obtain the BiGd:YIG single crystal, a flux method, a floating method, a liquid phase epitaxy method or the like is employed. For example, in the flux method, ferric oxide ($Fe_2O_3$), yttrium trioxide ($Y_2O_3$), bismuth trioxide ($Bi_2O_3$) and gadolinium trioxide ($Gd_2O_3$) are dissolved as solutes in a solvent containing lead oxide (PbO) and boron trioxide ($B_2O_3$) to prepare a solution. A seed crystal is placed in the thus-prepared solution, followed by gradual cooling to obtain a bulk crystal. The TSFZ method, which is a floating method, produces a bulk crystal in the same manner. On the other hand, in the liquid phase epitaxy method (abbreviated to "the LPE method" hereinafter), a YIG single crystal thin film is grown on gadolinium.gallium.garnet ($Gd_3Ga_5O_{12}$: abbreviated to "GGG" hereinafter) to obtain a YIG single crystal film.

In order to obtain a Ce:YIG single crystal having a size sufficient for use as a material for optical communication and an electronic device, the above-described methods are used. However, for example, the LPE method has the problem that the Ce content of YIG is low, and Ce is contained in the crystal as a tetravalent ion, not as a trivalent ion, thereby obtaining no Faraday effect and making the YIG single crystal unsuitable as an optical material due to an increase in light absorption. This is true of the crystals obtained by the flux method and the TSFZ method.

Therefore, only a thin film of a Ce:YIG single crystal can be obtained by the sputtering method, and a Ce-containing magnetic garnet single crystal having a size sufficient for use as a material for optical communication of an isolator and a material for an electronic device cannot be produced.

SUMMARY OF THE INVENTION

Accordingly, an object of the present invention is to provide a cerium-containing magnetic garnet single crystal which can be used as a material for optical communication of an isolator or the like and for an electronic device, and a method of producing the same.

In accordance with the present invention, there is provided a cerium-containing magnetic garnet single crystal obtained by melting a cerium-containing magnetic garnet polycrystal while applying a large temperature gradient to the solid-liquid interface, and then solidifying the resultant melt.

In accordance with the present invention, a cerium-containing magnetic garnet single crystal having a size which so far has not been obtained (e.g., a thickness of 3 $\mu$m or more, preferably about 5 $\mu$m or more) can be obtained. The thus-obtained single crystal can be used as a material for optical communication of an isolator and for an electronic device.

In the present invention, the polycrystal used as a raw material is represented by the formula $Ce_xR_{3-x}M_yFe_{5-y}O_{12}$ wherein R is at least one element selected from Y and the rare earth elements of the atomic numbers 59 to 71, M is at least one of Ga and Al, and x and y preferably satisfy the relations $0<x<2$ and $0<y<2$, respectively. In this case, a cerium-containing magnetic garnet single crystal having the same $Ce_xR_{3-x}M_yFe_{5-y}O_{12}$ formula is obtained.

In one embodiment of the present invention, the polycrystal used as the raw material may be represented by the formula $Ce_xY_{3-x}M_yFe_{5-y}O_{12}$. In this case, a cerium-containing magnetic garnet single crystal represented by the formula $Ce_xY_{3-x}M_yFe_{5-y}O_{12}$ is obtained.

In accordance with another embodiment of the present invention, there is provided a method of producing a cerium-containing magnetic garnet single crystal comprising the steps of preparing a polycrystal of cerium-containing magnetic garnet, melting the polycrystal while applying a large temperature gradient to the solid-liquid interface, and solidifying the melted polycrystal.

In accordance with a further embodiment of the present invention, there is provided a method of producing a cerium-containing magnetic garnet single crystal comprising the steps of preparing a polycrystal of cerium-containing magnetic garnet, preparing a seed crystal of a cerium-containing magnetic garnet single crystal and bringing the seed crystal in contact with the polycrystal, melting a portion of the polycrystal which contacts the seed crystal by an optical heating device for applying a large temperature gradient to the solid-liquid interface to form a melt zone, and moving the melt zone to cool the portion which has been melted immediately before the melt zone is moved.

In accordance with the present invention, a large temperature gradient can be applied to the solid-liquid interface by heating with the optical heating device. It is thus possible to obtain a cerium-containing magnetic garnet single crystal having a size which so far has not been obtained. The thus-obtained single crystal can be used as a material for optical communication of an isolator and for an electronic device.

In the method of producing a cerium-containing magnetic garnet single crystal in accordance with the present invention, the optical heating device can comprise a main heating device and an auxiliary heating device, wherein the main heating device preferably contains a laser device for applying a laser beam directly to a heating portion of the polycrystal, and the auxiliary heating device preferably contains a light source as a heat source, and a reflecting plate for reflecting the light emitted from the light source and condensing the reflected light on the heating portion. In this case, the portion on which the laser beam and the reflected light are condensed is melted, and a sharp, large temperature gradient with good uniformity is applied to the solid-liquid interface. When the condensing position is moved, the portion where the light is not condensed is rapidly cooled. As a result, a large, high-quality single crystal which so far has not been obtained is obtained.

Furthermore, in the method of producing a cerium-containing magnetic garnet single crystal in accordance with the present invention, the polycrystal of cerium-containing magnetic garnet may be prepared in any one of the shapes of a rod, a thin sheet and a thin film. Thus, a cerium-containing magnetic garnet single crystal having any shape can be obtained.

The above object, other objects, characteristics and advantages of the present invention will be made more apparent from the description of embodiments and examples below with reference to the drawings.

DESCRIPTION OF THE PREFERRED EMBODIMENT

The inventors developed a laser condensing single crystal growing method. This method is capable of producing YIG single crystal fibers and a YIG single crystal film from a coincident melt composition of YIG without using a flux. This method comprises condensing a laser beam to form a sharp, large temperature gradient in the solid-liquid interface so that single-phase YIG can be produced by the effect of the temperature gradient without generating orthoferrite which is otherwise generated in an equilibrium state. The inventors also found that the Ce:YIG single crystal (cerium-containing magnetic garnet single crystal) obtained by the laser condensing single crystal growing method has a large Faraday effect.

Figure 1A:
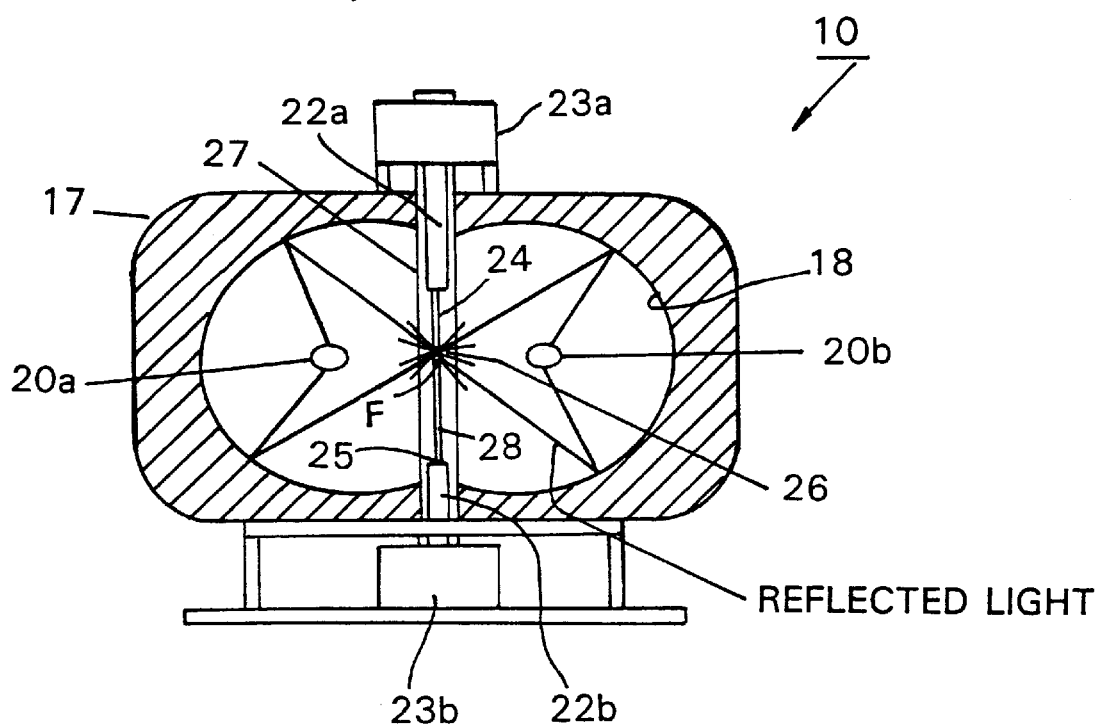
FIG. 1A is a sectional front view of an example of a single crystal growing apparatus used for producing a fibrous cerium-containing magnetic garnet single crystal in accordance with the present invention.
Figure 1B:
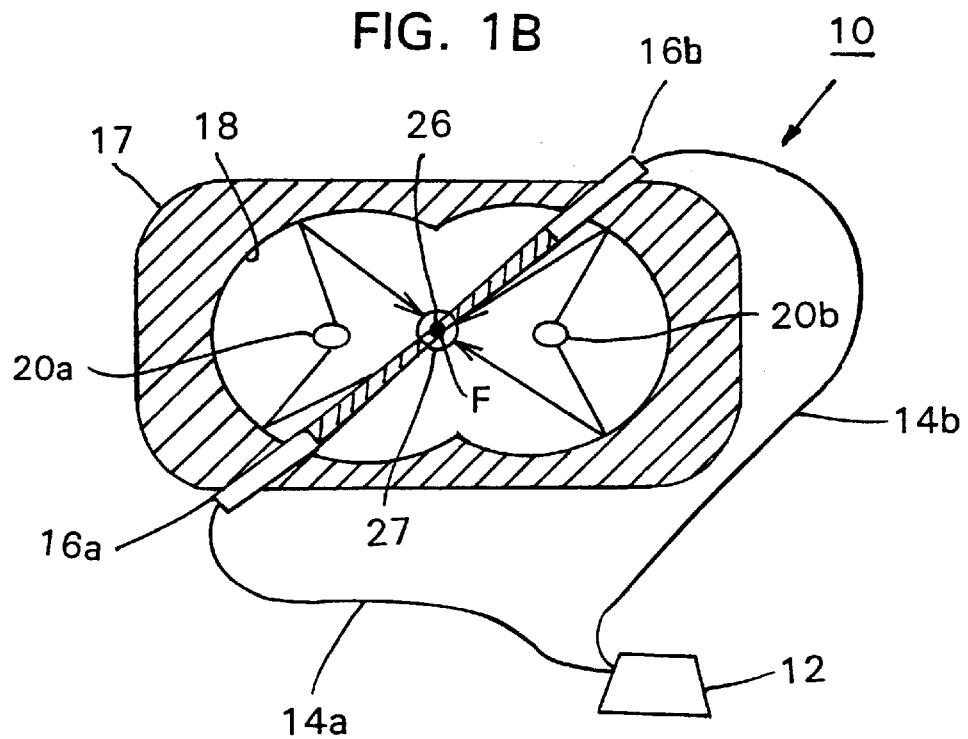
FIG. 1B is a sectional plan view of the same apparatus.

FIG. 1A is a sectional front view of an example of the single crystal growing apparatus used for producing a cerium-containing magnetic garnet single crystal in accordance with the present invention, and FIG. 1B is a sectional plan view of the same apparatus.

The single crystal growing apparatus 10 shown in the drawings comprises a YAG laser generator 12 which constitutes the main heating device. The YAG laser generator 12 comprises two laser beam emission ports 16a and 16b which are formed through fibers 14a and 14b, respectively.

The single crystal growing apparatus 10 further comprises a casing 17. In the casing 17 is formed as a reflecting plate a bi-elliptic mirror 18 having a three-dimensional shape and having a bi-ellipsoidal surface of revolution formed by revolution of a bi-ellipse about the long axis thereof. The "bi-ellipse" means the shape formed by combining two ellipses with a common focal point. The laser beam emission ports 16a and 16b are provided opposite to each other with the central portion of the space formed by the bi-elliptic mirror 18 therebetween so as to pass through the casing 17 and the bi-elliptic mirror 18.

In the bi-elliptic mirror 18 are disposed halogen lamps 20a and 20b at positions corresponding to the focal points of the respective ellipses. The bi-elliptic mirror 18 and the halogen lamps 20a and 20b constitute an optical heating device serving as the auxiliary heating device. Each of the halogen lamps 20a and 20b is a light source as a heat source. The light emitted from the halogen lamps 20a and 20b is reflected by the inner surface of the bi-elliptic mirror 18 and condensed on the common focal point F of the bi-ellipse. The laser beams emitted through the laser beam emission ports 16a and 16b are also directed to the common focal point F of the ellipses in the bi-elliptic mirror 18.

Therefore, a sample positioned at the common focal point in the central portion of the space formed by the bi-elliptic mirror 18 is heated. In addition, the output of the YAG laser and the outputs of the halogen lamps 20a and 20b can be adjusted so as to produce optimum temperature distribution and temperature gradient. In the present invention, the temperature at the common focal point F becomes, for example, about 1700° C., but the periphery thereof is not heated. Thus, the temperature rapidly decreases in the direction away from the common focal point F, thereby forming a sharp, large temperature gradient in the heating portion and the vicinity thereof.

In the inside of the bi-elliptic mirror 18, upper and lower shafts 22a and 22b for holding a raw material rod and a seed crystal are positioned opposite to each other with the common focal point F therebetween. The upper and lower shafts 22a and 22b are outwardly projected from the inside of the bi-elliptic mirror 18 and attached to an upper shaft moving device 23a and a lower shaft moving device 23b, respectively. The upper shaft moving device 23a and the lower shaft moving device 23b synchronously axially move the upper shaft 22a and the lower shaft 22b, respectively. The moving speed is preferably about 1 to 8 mm/hr. The moving speeds of the upper shaft 22a and the lower shaft 22b may be the same or different. When the distance between the upper shaft 22a and the lower shaft 22b gradually increases, a thin single crystal can be obtained. When the distance between the upper and lower shafts 22a and 22b gradually decreases, a thick single crystal can be obtained. The single crystal growing apparatus 10 employs a system in which the condensing position of the laser beams and reflected light for heating is fixed, while the raw material rod is moved. However, conversely, the apparatus may have a system in which the condensing position of the laser beams and reflected light is moved, with the raw material rod fixed.

At the end of the upper shaft 22a opposite to the lower shaft 22b is fixed as a raw material rod 24, a cerium-containing magnetic garnet polycrystal having the shape of, for example, a round rod, a square rod, a plate or another form. The composition of the cerium-containing magnetic garnet polycrystal is represented by the formula $Ce_xR_{3-x}M_yFe_{5-y}O_{12}$ wherein R is at least one element selected from Y and the rare earth elements of the atomic numbers of 59 to 71, and M is at lease one of Ga and Al.

Figure 5:
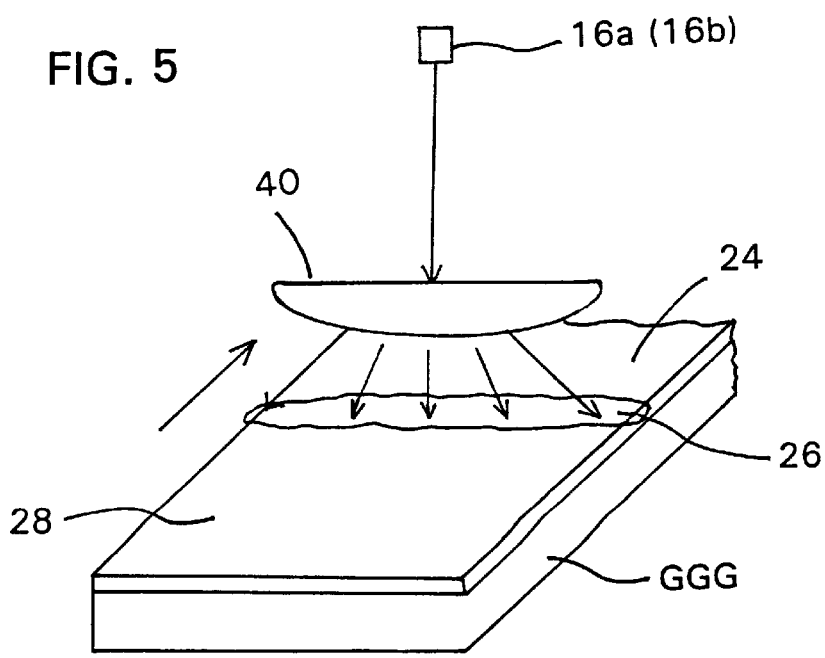
FIG. 5 illustrates a principal portion of a modified example of the single crystal growing apparatus shown in FIG. 1.

If the raw material rod is a round rod, a fibrous single crystal having a circular section form is obtained, and if a square rod is used as the raw material rod 24, a fibrous or sheet-like single crystal having a rectangular section form is obtained. When a single crystal having a rectangular section form is desired to be obtained, the spot of the laser beam applied is adjusted to, for example, an oblong form in order to easily obtain such a single crystal. For example, when the raw material 24 is wide, as shown in FIG. 5, the laser beam may be dispersed by a lens 40 to widen the irradiation spot.

At the end of the lower shaft 22b opposite to the upper shaft 22a is fixed a seed crystal 25. The raw material rod 24 and the seed crystal 25 are held opposite to each other as described above. As the seed crystal 25, a Ce:YIG single crystal is preferably used, but a YIG single crystal may be used. The seed crystal 25 may be attached to the upper shaft 22a, and the raw material rod 24 may be attached to the lower shaft 22b.

In addition, for example, a raw material 24 obtained by coating a cerium-containing magnetic garnet polycrystal in the form of a slurry on a GGG substrate and then drying the polycrystal may be used in place of the raw material rod 24. In this case, a sheet-like or thin film cerium-containing magnetic garnet single crystal can be obtained on the GGG substrate. In this case, either of the upper and lower shafts 22a and 22b may be used for holding and moving the raw material 24.

Furthermore, the upper shaft 22a, the lower shaft 22b, the raw material rod 24, the seed crystal 25 and the resultant single crystal may be contained in a quartz tube 27. The atmosphere in the quartz tube 27 can be appropriately adjusted by inserting Ar gas or $O_2$ gas in accordance with production conditions for the single crystal.

The method of producing the cerium-containing magnetic garnet single crystal by the single crystal growing apparatus 10 will be described below. The end of the raw material rod 24 opposite to the seed crystal 25 is first positioned at the common focal point F. The end of the raw material rod 24 is then melted by heating to an appropriate temperature, e.g., about 1700° C., with the main heating device and the auxiliary heating device. The end of the seed crystal 25 is put into contact with the melted end of the raw material rod 24 to form a melt zone 26. Namely, the melt zone 26 is formed at a position corresponding to the common focal point F of the bi-elliptic mirror 18. The upper and lower shafts 22a and 22b are then axially moved as described above to move the melt zone 26 from one end of the raw material 24 to the other end thereof, thereby continuously causing melting and solidification. As a result, the intended cerium-containing magnetic garnet single crystal 28 can be obtained.

Figure 2:
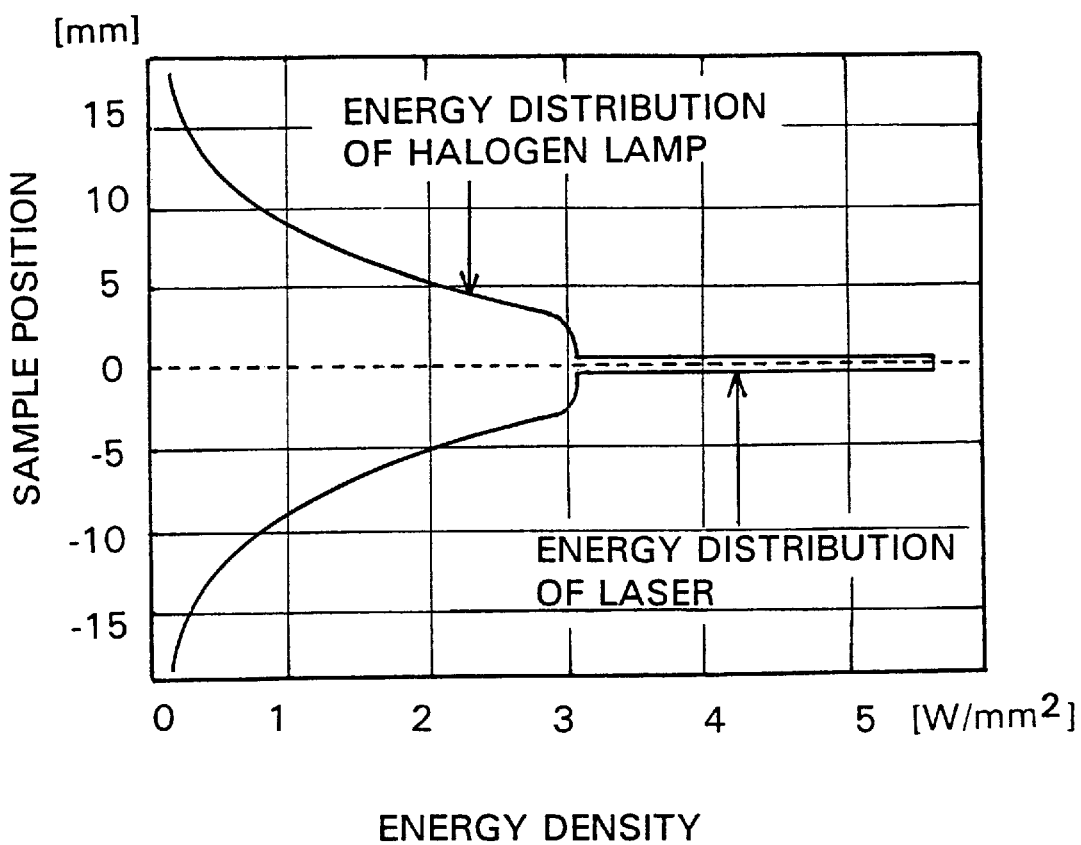
FIG. 2 is a graph showing the relation between the sample position and the energy distributions of a laser beam of a main heating device and a halogen lamp of an auxiliary heating device.
Figure 3:
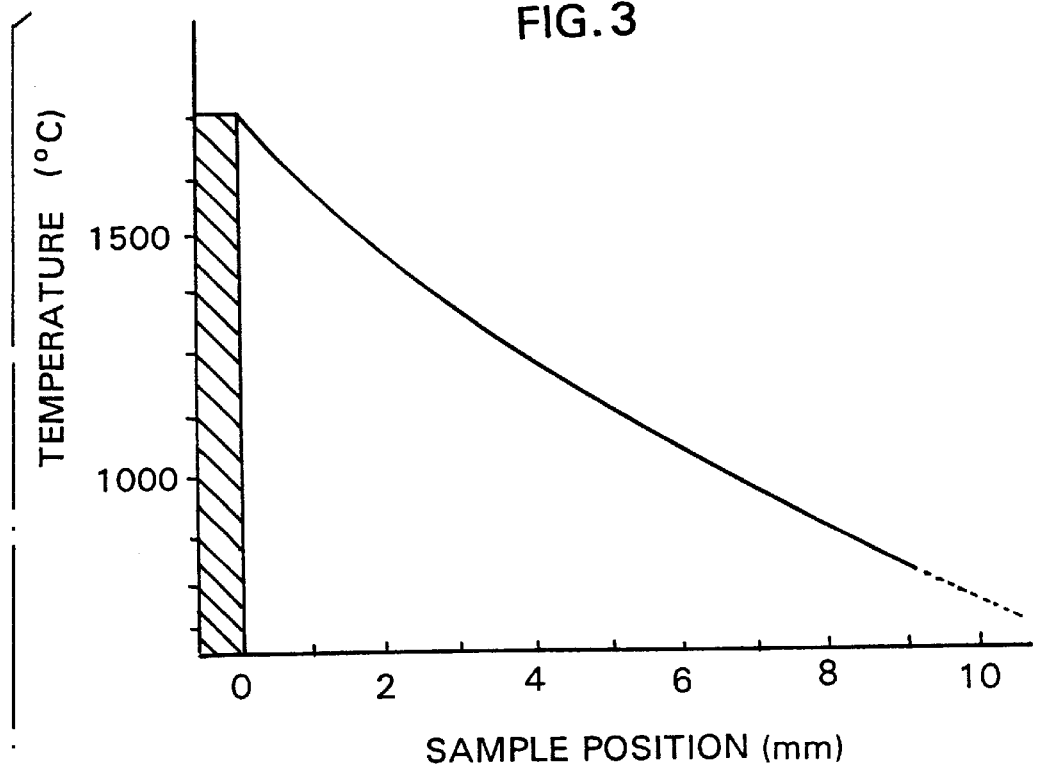
FIG. 3 is a graph showing the relation between the sample position and temperature.
Figure 3:
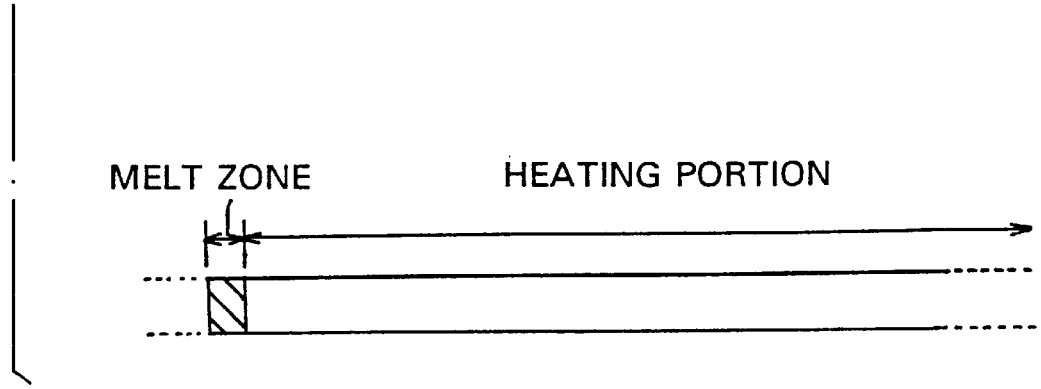

FIG. 2 is a graph showing the relation between the sample position and the energy distributions of the laser beam of the main heating device and the halogen lamp of the auxiliary heating device. FIG. 3 is a graph showing the relation between the sample position and the temperature. In FIG. 3, the melt zone 26 is shown by a dark portion. In FIGS. 2 and 3, the sample position is indicated by the distance from the melt zone at the origin on the raw material rod 24.

FIG. 2 indicates that the halogen lamp has a relatively wide energy distribution, while the laser has a narrow, strong energy distribution. The single crystal growing apparatus 10 is capable of realizing a sharp, large energy distribution between the melt zone 26 and the vicinity thereof by combination of the energy of the halogen lamps and the laser energy. As a result, the single crystal growing apparatus 10 realizes a sharp, large temperature distribution of 800° C./10 mm, for example, as shown in FIG. 3, as a single crystal formation portion in the solid-liquid interface.

Although the heating device used in this example could realize such a temperature gradient even if the laser output is increased to further increase the temperature gradient, the desired object is thought to be attained. With a temperature gradient of less than about 500° C./10 mm, the undesirable tendency that orthoferrite is first precipitated is increased. Preferably the temperature gradient is at least about 600° C./10 mm.

Examples of the fibrous cerium-containing magnetic garnet single crystal will be described below. The YAG laser beam used for these examples has a wavelength of 1.064 μm and an output of 20 W. The halogen lamps 20a and 20b each have an output of, for example, 250 W, i.e., 500 W in total. The distance between the sample and each of the halogen lamps 20a and 20b is about 10 cm. In this case, the temperature of the raw material rod 24 at the common focal point is about 1700° C. In these examples, the light-condensing spot has a substantially elliptic shape of 1 mm long and 6 mm wide.

In order to examine the relation between the diameter of the raw material rod and the moving speed, $(Ce_{0.3}Y_{2.7})Fe_5O_{12}$ rods having various diameters were prepared as raw material rods of a cerium-containing magnetic garnet polycrystal as a crystal raw material. (111) YIG having a diameter of 1 mm was prepared as the seed crystal. Both materials were held in the above single crystal growing apparatus 10, and each of the raw material rods was irradiated with constant lamp power and laser power to produce a crystal while changing the moving speed of the raw material rod. The thus-obtained crystal was subjected to analysis of the composition and measurement of the Faraday effect. The results obtained are shown in Table 1.

TABLE 1

| Raw Material Diameter mm | | 0.5 | 0.8 | 1.0 | 1.5 | 2.0 | 2.5 | 3.0 |
|---|---|---|---|---|---|---|---|---|
| Moving Speed mm/h | 0.2 | ◎ | ◎ | ◎ | ◎ | ○ | x | x |
| | 0.5 | ◎ | ◎ | ◎ | ◎ | ○ | x | x |
| | 1.0 | ◎ | ◎ | ◎ | ○ | x | x | — |
| | 2.0 | ◎ | ◎ | ◎ | ○ | x | x | — |

TABLE 1-continued

| Raw Material Diameter mm | 0.5 | 0.8 | 1.0 | 1.5 | 2.0 | 2.5 | 3.0 |
|---|---|---|---|---|---|---|---|
| 4.0 | ⊚ | ⊚ | ⊚ | x | x | x | — |
| 8.0 | ⊚ | ○ | ○ | x | x | — | — |
| 16.0 | ○ | x | x | x | x | — | — |
| 32.0 | x | x | x | — | — | — | — |

⊚: Single crystal with Faraday effect
○: Single crystal without Faraday effect
x: No formation of single crystal
—: No experiment In the Table 1 region marked with ⊚, a $(Ce_{0.3}Y_{2.7})Fe_5O_2$ single crystal was obtained, and a large Faraday effect was observed. While in the region marked with ○, a $(Ce_{0.3}Y_{2.7})Fe_5O_{12}$ single crystal was obtained, but the Faraday effect was not observed, and large light absorption was measured. It was thus thought that in this region, Ce is present as a tetravalent ion, and not a trivalent ion. In the region marked with x, no single crystal was obtained, and the orthoferrite component was observed.

Figure 4:
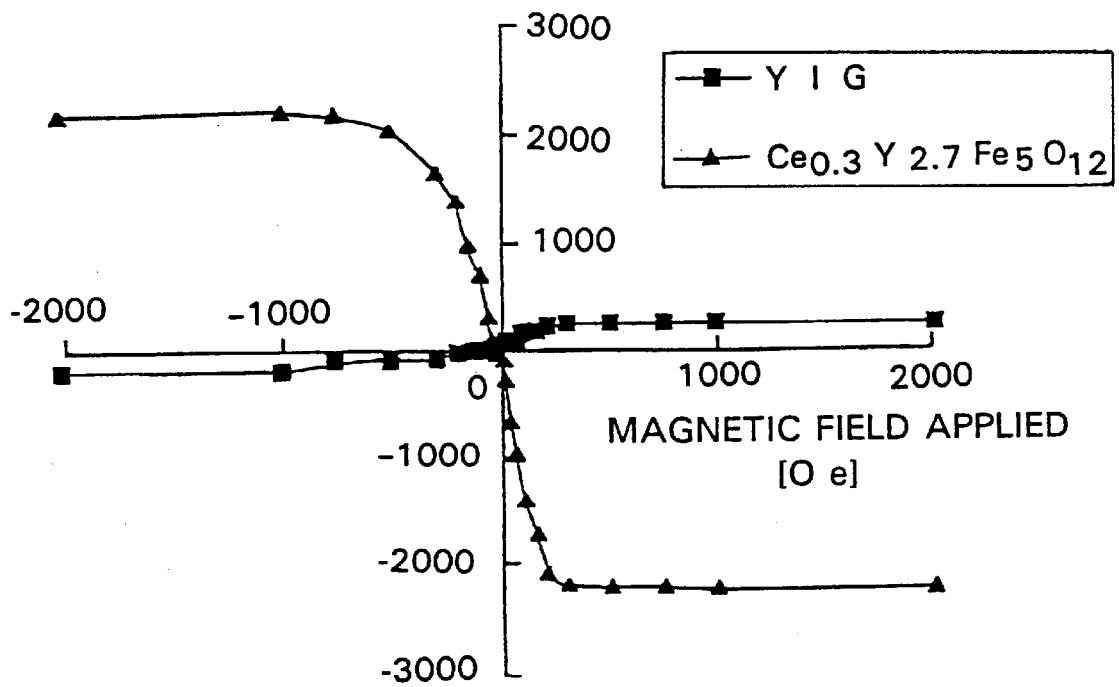
FIG. 4 is a graph showing a comparison of the Faraday effects of a cerium-containing magnetic garnet single crystal of the present invention and a conventional YIG.

FIG. 4 is a graph showing a comparison of the Faraday effects of a cerium-containing magnetic garnet single crystal of the present invention and conventional YIG. This graph shows the results of measurement of an angle of Faraday rotation per cm using light having a wavelength of 1.3 μm with respect to a $(Ce_{0.3}Y_{2.7})Fe_5O_{12}$ single crystal fiber having a diameter of 0.8 mm and prepared as the cerium-containing magnetic garnet single crystal of the present invention. The Faraday effect of a YIG single crystal fiber as a comparative example was measured under the same conditions as described above.

In order to examine the relation between the cerium concentration and the moving speed, a fibrous cerium-containing magnetic garnet single crystal having a diameter of 0.8 mm was prepared while changing the concentration x of $(Ce_xY_{3-x})Fe_5O_{12}$ under the same conditions as described above. The conditions for growing the single crystal were the same as described above. The results obtained are shown in Table 2.

TABLE 2

| Ce Concentration x | | 0.1 | 0.5 | 1.0 | 1.5 | 2.0 | 2.5 | 3.0 |
|---|---|---|---|---|---|---|---|---|
| Moving Speed mm/h | 0.2 | ⊚ | ⊚ | ⊚ | ⊚ | ⊚ | ○ | x |
| | 0.5 | ⊚ | ⊚ | ⊚ | ⊚ | ⊚ | ○ | x |
| | 1.0 | ⊚ | ⊚ | ⊚ | ⊚ | ○ | x | — |
| | 2.0 | ⊚ | ⊚ | ⊚ | ○ | x | x | — |
| | 4.0 | ⊚ | ⊚ | ⊚ | x | x | — | — |
| | 8.0 | ⊚ | ⊚ | ○ | x | — | — | — |
| | 16.0 | ○ | ○ | x | — | — | — | — |
| | 32.0 | x | x | x | — | — | — | — |

⊚: Single crystal with Faraday effect
○: Single crystal without Faraday effect
x: No formation of single crystal
—: No experiment In the Table 2 region marked with ⊚, the $(Ce_xY_{3-x})Fe_5O_{12}$ single crystal was obtained, and a large Faraday effect was observed. While, in the region marked with ○, the $(Ce_xY_{3-x})Fe_5O_{12}$ single crystal was obtained, but the Faraday effect was not observed, and large light absorption was observed. It was thus thought that in this region, Ce is present as a tetravalent ion, not a trivalent ion. In the region marked with x, no single crystal was obtained, and the orthoferrite component was observed.

As described above, the growing conditions in accordance with the present invention are controlled by using the laser condensing single crystal growing method so that a Ce-substituted YIG single crystal (a cerium-containing magnetic garnet single crystal) having the large Faraday effect and a large constant size which so far has been not produced can be obtained.

In the present invention, a sharp, large temperature gradient is applied to the solid-liquid interface between the melt zone and the solid to precipitate an intended single crystal within a short time before a heterogeneous phase, i.e., orthoferrite, is precipitated. Namely, orthoferrite nuclei are produced and then grown large to precipitate a heterogeneous phase. However, in the present invention, since a single crystal is grown under the large, sharp temperature gradient, the intended single crystal can be precipitated before the heterogeneous phase is precipitated.

Accordingly, the temperature history in the solid-liquid interface in the present invention is important, and the uniformity of the temperature gradient in the solid-liquid interface is preferably improved for growing the intended single crystal. In the above examples, as the diameter of the fiber used decreases, the uniformity of the temperature gradient in the solid-liquid interface is improved. In addition, as the moving speed of the melt zone decreases, the uniformity of the temperature gradient in the solid-liquid interface is improved due to a thermally stationary state.

The present invention is characterized by realizing a sharp, large temperature gradient in the solid-liquid interface, and preferably improving the uniformity of the temperature gradient in the solid-liquid interface. When these conditions are satisfied, a cerium-containing single crystal in any shape, e.g., a fiber, a sheet, a thin film, etc., can be grown.

A heating method other than the laser condensing method can produce the same effects as described above as long as the conditions which characterize the present invention are satisfied. For example, a heater method or a method in which a melt is formed in a noble metal crucible heated by radio-frequency induction and a single crystal is pulled out of the melt and rapidly cooled also produces the same effects as long as the above conditions are satisfied.

EXAMPLES

Example 1

A polycrystal of $(Ce_{0.5}Gd_xY_{2.5-x})(Al_yFe_{5-y})O_{12}$ in which the Y site was partly replaced by Gd and the Fe site was partly replaced by Al was prepared. A fibrous single crystal having a circular sectional form having a diameter of 1 mm and a length of 30 cm was produced by using the single crystal growing apparatus 10 shown in FIG. 1 under the same conditions as described above. The composition of the resultant single crystal was represented by $(Ce_{0.5}Gd_xY_{2.5-x})(Al_yFe_{5-y})O_{12}$. The results obtained are shown in Table 3. Under conditions marked with ⊚, a single crystal was formed and the large Faraday effect was observed.

TABLE 3

| Gd Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |

TABLE 3-continued

| Gd Concentration x | 0.1 | 0.3 | 0.5 | 1.0 | 1.5 | 2.0 | 2.5 |
|---|---|---|---|---|---|---|---|
| 1.5 | ⊚ | ⊚ | ⊚ | ○ | ○ | x | x |
| 2.0 | ⊚ | ⊚ | ⊚ | ○ | ○ | x | x |
| 2.5 | ○ | ○ | ○ | x | x | x | — |

⊚: Single crystal with Faraday effect
○: Single crystal without Faraday effect
x: No formation of single crystal
—: No experiment Example 2

A fibrous single crystal which had a circular sectional form having a diameter of 1 mm and a length of 30 cm and in which the Y site was partly replaced by each of Pr, Nd, Pm, Sm, Eu, Tb, Dy, Ho, Er, Tm, Yb and Lu, and the Fe site was partly replaced by Al was produced under the same conditions as Example 1. The compositions of the resultant single crystals were respectively represented by $(Ce_{0.5}Pr_xY_{2.5-x})(Al_yFe_{5-y})O_{12}$; $(Ce_{0.5}Nd_xY_{2.5-x})(Al_yFe_{5-y})O_{12}$; $(Ce_{0.5}Pm_xY_{2.5-x})(Al_yFe_{5-y})O_{12}$; $(Ce_{0.5}Sm_xY_{2.5-x})(Al_yFe_{5-y})O_{12}$; $(Ce_{0.5}Eu_xY_{2.5-x})(Al_yFe_{5-y})O_{12}$; $(Ce_{0.5}Tb_xY_{2.5-x})(Al_yFe_{5-y})O_{12}$; $(Ce_{0.5}Dy_xY_{2.5-x})(Al_yFe_{5-y})O_{12}$; $(Ce_{0.5}Ho_xY_{2.5-x})(Al_yFe_{5-y})O_{12}$; $(Ce_{0.5}Er_xY_{2.5-x})(Al_yFe_{5-y})O_{12}$; $(Ce_{0.5}Tm_xY_{2.5-x})(Al_yFe_{5-y})O_{12}$; $(Ce_{0.5}Yb_xY_{2.5-x})(Al_yFe_{5-y})O_{12}$; and $(Ce_{0.5}Lu_xY_{2.5-x})(Al_yFe_{5-y})O_{12}$.

The results obtained are shown in Tables 4 to 15. In each of the tables, under the conditions marked with ⊚, a single crystal was formed and the large Faraday effect was observed.

TABLE 4

| Pr Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 5

| Nd Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 6

| Pm Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 7

| Sm Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 8

| Eu Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | o |
| | 0.4 | ⊚ | ⊚ | ⊚ | ⊚ | ⊚ | o | o |
| | 0.8 | ⊚ | ⊚ | ⊚ | ⊚ | o | o | x |
| | 1.0 | ⊚ | ⊚ | ⊚ | ⊚ | o | x | x |
| | 1.5 | ⊚ | ⊚ | ⊚ | o | o | x | x |
| | 2.0 | ⊚ | ⊚ | ⊚ | o | o | x | x |
| | 2.5 | o | o | o | x | x | x | — |

⊚: Single crystal with Faraday effect
o: Single crystal without Faraday effect
x: No formation of single crystal
—: No experiment

TABLE 9

| Tb Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | o |
| | 0.4 | ⊚ | ⊚ | ⊚ | ⊚ | ⊚ | o | o |
| | 0.8 | ⊚ | ⊚ | ⊚ | ⊚ | o | o | x |
| | 1.0 | ⊚ | ⊚ | ⊚ | ⊚ | o | x | x |
| | 1.5 | ⊚ | ⊚ | ⊚ | o | o | x | x |
| | 2.0 | ⊚ | ⊚ | ⊚ | o | o | x | x |
| | 2.5 | o | o | o | x | x | x | — |

⊚: Single crystal with Faraday effect
o: Single crystal without Faraday effect
x: No formation of single crystal
—: No experiment

TABLE 10

| Dy Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 11

| Ho Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 12

| Er Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 13

| Tm Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 14

| Yb Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment

TABLE 15

| Lu Concentration x | | 0.1 | 0.3 | 0.5 | 1.0 | 1.5 | 2.0 | 2.5 |
|---|---|---|---|---|---|---|---|---|
| Al Concentration y | 0.1 | ⊚ | ⊚ | ⊚ | ⊚ | ⊚ | ⊚ | ⊚ |
| | 0.2 | ⊚ | ⊚ | ⊚ | ⊚ | ⊚ | ⊚ | ○ |
| | 0.4 | ⊚ | ⊚ | ⊚ | ⊚ | ⊚ | ○ | ○ |
| | 0.8 | ⊚ | ⊚ | ⊚ | ⊚ | ○ | ○ | x |
| | 1.0 | ⊚ | ⊚ | ⊚ | ⊚ | ○ | x | x |
| | 1.5 | ⊚ | ⊚ | ⊚ | ○ | ○ | x | x |
| | 2.0 | ⊚ | ⊚ | ⊚ | ○ | ○ | x | x |
| | 2.5 | ○ | ○ | ○ | x | x | x | — |

⊚: Single crystal with Faraday effect
○: Single crystal without Faraday effect
x: No formation of single crystal
—: No experiment With the composition of each of Examples 1 and 2, a magnetic garnet single crystal in which yttrium is entirely replaced by, for example, samarium, exhibits the same effects as described above.

Example 3

Cerium-containing magnetic garnet single crystals in which the Fe site was partly replaced by Ga in place of Al were produced under the same conditions as Examples 1 and 2. The compositions of the resultant single crystals were respectively represented by $(Ce_{0.5}Gd_xY_{2.5-x})(Ga_yFe_{5-y})O_{12}$; $(Ce_{0.5}Pr_xY_{2.5-x})(Ga_yFe_{5-y})O_{12}$; $(Ce_{0.5}Nd_xY_{2.5-x})(Ga_yFe_{5-y})O_{12}$; $(Ce_{0.5}Pm_xY_{2.5-x})(Ga_yFe_{5-y})O_{12}$; $(Ce_{0.5}Sm_xY_{2.5-x})(Ga_yFe_{5-y})O_{12}$; $(Ce_{0.5}Eu_xY_{2.5-x})(Ga_yFe_{5-y})O_{12}$; $(Ce_{0.5}Tb_xY_{2.5-x})(Ga_yFe_{5-y})O_{12}$; $(Ce_{0.5}Dy_xY_{2.5-x})(Ga_yFe_{5-y})O_{12}$; $(Ce_{0.5}Ho_xY_{2.5-x})(Ga_yFe_{5-y})O_{12}$; $(Ce_{0.5}Er_xY_{2.5-x})(Ga_yFe_{5-y})O_{12}$; $(Ce_{0.5}Tm_xY_{2.5-x})(Ga_yFe_{5-y})O_{12}$; $(Ce_{0.5}Yb_xY_{2.5-x})(Ga_yFe_{5-y})O_{12}$; and $(Ce_{0.5}Lu_xY_{2.5-x})(Ga_yFe_{5-y})O_{12}$.

With these single crystals, the same effects as those shown in Tables 3 to 5 could be obtained using the about the same values of x and y.

Example 4

A sheet-shaped cerium-containing magnetic garnet single crystal having a width of 2 mm, a thickness of 0.8 mm and a length of 20 mm was produced by using the single crystal growing apparatus 10 shown in FIG. 1. The composition of the single crystal was the same as Examples 1 to 3. As a result, a cerium-containing magnetic garnet single crystal sheet was obtained in the same manner as the fibrous single crystals.

Example 5

A cerium-containing magnetic garnet polycrystal was adhered in the form of a slurry having a thickness of 50 μm to a (111) GGG single crystal substrate having a width of 2 mm, a thickness of 0.5 mm and a length of 50 μmm, followed by single crystal growth using the single crystal growing apparatus 10 shown in FIG. 1. As a result, a cerium-containing magnetic garnet single crystal film having the same composition as Examples 1 to 4 was obtained on the GGG substrate. With the YIG single crystal films, the Faraday effect was observed in the same manner as the results shown in Tables 3 to 15.

Figure 6:
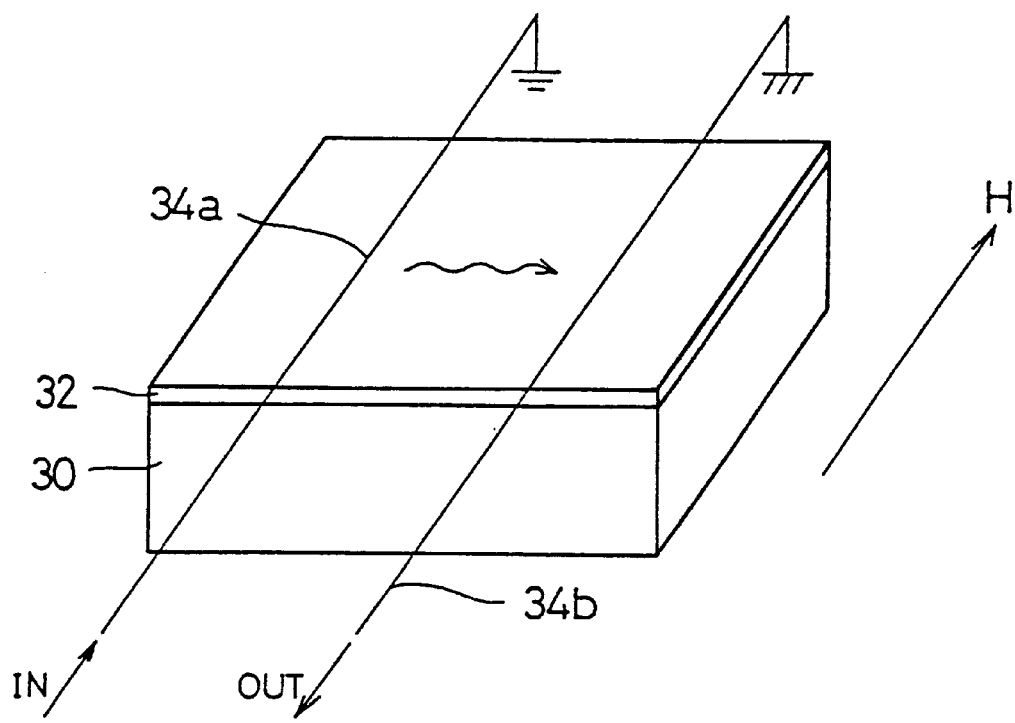
FIG. 6 illustrates the method of measuring filter characteristics in Example 5.
Figure 7:
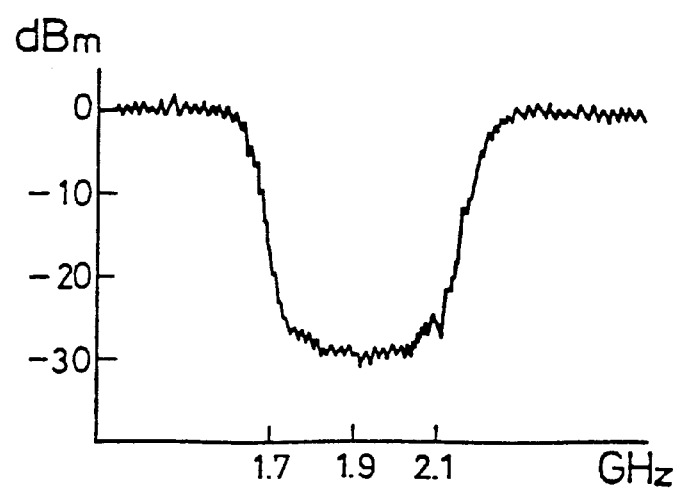
FIG. 7 is a graph showing the results of measurement of the filter characteristics in Example 5.

Furthermore, an electrode was attached to the resultant YIG single crystal film, and filter characteristics were measured with 1.9 GHz, as shown in FIG. 6. In FIG. 6, a YIG single crystal film 32 was formed on a GGG substrate 30, and a signal input transducer 34a and a signal output transducer 34b were formed on the YIG single crystal film 32. As a result, good filter characteristics were obtained, as shown in FIG. 7.

In accordance with the present invention, it is possible to obtain a Ce:YIG single crystal (cerium-containing magnetic garnet single crystal) having a size and quality sufficient for use as a material for optical communication of an isolator and for an electronic device. The present invention can also increase the efficiency of use as a material, decrease the production time, make it unnecessary to use lead which is a toxic substance, and decrease the cost.

What is claimed is:

1. A method of producing a cerium-containing magnetic garnet single crystal comprising the steps of:

providing a cerium-containing magnetic garnet polycrystal;

melting the polycrystal while applying a large temperature gradient to a solid-liquid interface; and solidifying the melted polycrystal.

2. A method of producing a cerium-containing magnetic garnet single crystal according to claim 1, wherein said temperature gradient is at least about 600° C./10 mm.

3. A method of producing a cerium-containing magnetic garnet single crystal according to claim 1, wherein said temperature gradient is applied in a melt zone and said solidifying is effected by moving the melted polycrystal and melt zone relative to each other.

4. A method of producing a cerium-containing magnetic garnet single crystal according to claim 3 further comprising a step of contacting a seed crystal of a magnetic garnet single crystal with the polycrystal during said melting.

5. A method of producing a cerium-containing magnetic garnet single crystal according to claim 4 wherein said polycrystal and seed crystal are carried by first and second movable supports and said supports are moved relative to said melt zone during said method.

6. A method of producing a cerium-containing magnetic garnet single crystal according to claim 5 wherein said supports are moved relative to said melt zone during said method at a speed of about 1–8 mm/hr.

7. A method of producing a cerium-containing magnetic garnet single crystal according to claim 3, wherein said melting is effected with an optical heater.

8. A method of producing a cerium-containing magnetic garnet single crystal according to claim 7, wherein said optical heater comprises a laser adapted to apply a laser beam directly to a heating portion of the polycrystal disposed in said melt zone.

9. A method of producing a cerium-containing magnetic garnet single crystal according to claim 8, wherein said optical heater device further comprises a light heat generator and a reflector adapted to reflect light emitted so as to condense the light on the heating portion.

10. A method of producing a cerium-containing magnetic garnet single crystal according to claim 9, wherein said reflector is a bi-elliptic reflector having a focal point at said heating portion.

11. A method of producing a cerium-containing magnetic garnet single crystal according to claim 1, wherein the melting and solidification are controlled such that the resulting cerium-containing magnetic garnet single crystal is in the shape of a rod, a sheet or a thin film.

12. A method of producing a cerium-containing magnetic garnet single crystal according to claim 1, wherein said polycrystal is carried by a movable support and said support is moved relative to said heating zone during said method.

13. A method of producing a cerium-containing magnetic garnet single crystal according to claim 12 wherein said supports are moved relative to said melt zone during said method at a speed of about 1–8 mm/hr.

14. A method of producing a cerium-containing magnetic garnet single crystal according to claim 1, wherein said melting is effected with an optical heater which comprises a laser adapted to apply a laser beam directly to a heating portion of the polycrystal disposed in said melt zone and a light heat generator and a reflector adapted to reflect light emitted so as to condense the light on the heating portion.

15. A method of producing a cerium-containing magnetic garnet single crystal according to claim 14, wherein said reflector is a bi-elliptic reflector having a focal point at said heating portion.

* * * * *